United States Patent
Kashefizadeh et al.

(10) Patent No.: US 7,846,824 B2
(45) Date of Patent: Dec. 7, 2010

(54) METHODS FOR FORMING A TITANIUM NITRIDE LAYER

(75) Inventors: Keyvan Kashefizadeh, Dublin, CA (US); Zhigang Xie, Sunnyvale, CA (US); Ashish S. Bodke, San Jose, CA (US); Mei Chang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 439 days.

(21) Appl. No.: 12/050,419

(22) Filed: Mar. 18, 2008

(65) Prior Publication Data

US 2009/0239378 A1 Sep. 24, 2009

(51) Int. Cl.
*H01L 21/22* (2006.01)
(52) U.S. Cl. .................. 438/584; 257/E21.169
(58) Field of Classification Search .......... 438/584; 257/E21.169
See application file for complete search history.

(56) References Cited

U.S. PATENT DOCUMENTS 7,253,109 B2   8/2007   Ding et al.

2005/0136656 A1   6/2005   Zeng et al.
2007/0193982 A1   8/2007   Brown et al.
2007/0241458 A1   10/2007   Ding et al.

FOREIGN PATENT DOCUMENTS

| EP | 1211332 A1 | 6/2002 |
| JP | 7-113170 A | 5/1995 |
| KR | 10-1998-021727 A | 6/1998 |

OTHER PUBLICATIONS

International Search Report and Written Opinion mailed Oct. 26, 2009 for PCT Application No. PCT/US2009/037525.

*Primary Examiner*—Bradley K Smith
*Assistant Examiner*—Amar Movva
(74) *Attorney, Agent, or Firm*—Moser IP Law Group

(57) ABSTRACT

Methods for forming titanium nitride layers are provided herein. In some embodiments, a method of forming a titanium nitride layer on a substrate may include providing a substrate into a processing chamber having a target comprising titanium disposed therein; supplying a nitrogen-containing gas into the processing chamber; sputtering a titanium source material from the target in the presence of a plasma formed from the nitrogen-containing gas to deposit a titanium nitride layer on the substrate; and upon depositing the titanium nitride layer to a desired thickness, forming a magnetic field that biases ions in the processing chamber away from the substrate.

20 Claims, 5 Drawing Sheets

METHODS FOR FORMING A TITANIUM NITRIDE LAYER

BACKGROUND OF THE INVENTION

1. Field of the Invention

The present invention generally relates to the fabrication of semiconductor devices, and more particularly, to methods for forming a titanium nitride layer on a substrate.

2. Description of the Related Art

Interconnect structures of integrated circuits and semiconductor devices are typically fabricated by forming a series of dielectric layers and conductive layers in order to create a three dimensional network of conductive layers separated by dielectric material. The interconnect structure may be fabricated using, for example, a damascene structure in which a dielectric layer such as a low k dielectric layer is formed atop one or more conductive plugs or sub-layers. In order to form an electrical connection to the conductive sub-layers, the dielectric is patterned and etched to define via openings therethrough. Formation of the via openings within the dielectric layer exposes a portion of the conductive line. Therefore, reliable formation of these interconnect features is an important factor in ensuring the quality, performance and reliability of devices formed on individual substrates and in each die.

Fabrication of such interconnect structures may be achieved by a variety of techniques. A typical method for forming layers for interconnection structure includes physical vapor deposition of a barrier layer over a feature, such as a trench or a via, followed by a physical vapor deposition a metal layer on the barrier layer to fill the feature. Finally, after the deposited material layers, including the metal and the dielectric layers, are formed on the substrate, a planarization or an etching process is performed to define a conductive interconnect feature with desired dimensions on the substrate.

One common material often utilized to fabricate barrier layers is titanium nitride. However, problems may be encountered during conventional processes for fabricating titanium nitride barrier layers. For example, in conventional titanium nitride physical vapor deposition techniques, particles (such as titanium nitride particles) may form during the process within the processing chamber. These particles may become deposited upon the surface of the substrate, thereby undesirably affecting film properties, such as uniformity, voids, or other defects.

Therefore, there is a need in the art for improved methods for forming titanium nitride layers.

SUMMARY OF THE INVENTION

Methods for forming titanium nitride layers are provided herein. In some embodiments, a method of forming a titanium nitride layer on a substrate may include providing a substrate into a processing chamber having a target comprising titanium disposed therein; supplying a nitrogen-containing gas into the processing chamber; sputtering a titanium source material from the target in the presence of a plasma formed from the nitrogen-containing gas to deposit a titanium nitride layer on the substrate; and upon depositing the titanium nitride layer to a desired thickness, forming a magnetic field that biases ions in the processing chamber away from the substrate.

In some embodiments, a method of forming an interconnection structure on a substrate may include providing a substrate having a first conductive layer disposed thereon; forming a titanium nitride barrier layer on the first conductive layer; upon depositing the titanium nitride layer to a desired thickness, forming a magnetic field that biases ions in the processing chamber away from the substrate; and forming a second conductive layer on the titanium nitride barrier layer.

In some embodiments, a method of forming an interconnection structure on a substrate may include providing a substrate having a dielectric layer disposed on a conductive layer comprising copper, the dielectric layer having a via formed therein to expose a portion of an upper surface of the first conductive layer; depositing a titanium nitride barrier layer by a PVD process within the via, the upper surface of the dielectric layer and the exposed surface of the conductive layer; upon forming the titanium nitride barrier layer to a desired thickness, forming a magnetic field that biases ions formed during the PVD process away from the substrate; and depositing a second conductive layer atop the titanium nitride barrier layer to fill the via formed within the dielectric layer.

BRIEF DESCRIPTION OF THE DRAWINGS

The teachings of the present invention can be readily understood by considering the following detailed description in conjunction with the accompanying drawings. It is to be noted, however, that the appended drawings illustrate only exemplary embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present invention generally provide methods for depositing a titanium nitride layer. The titanium nitride (TiN) layer may be utilized in various applications, such as for barrier applications in a metal interconnect fabrication process. The inventive methods may provide TiN layers having reduced defects as compared to titanium nitride layers formed via conventional physical vapor deposition techniques, thereby improving the integrity and reliability of devices formed utilizing titanium nitride layers as deposited by the inventive methods disclosed herein.

Figure 1A:
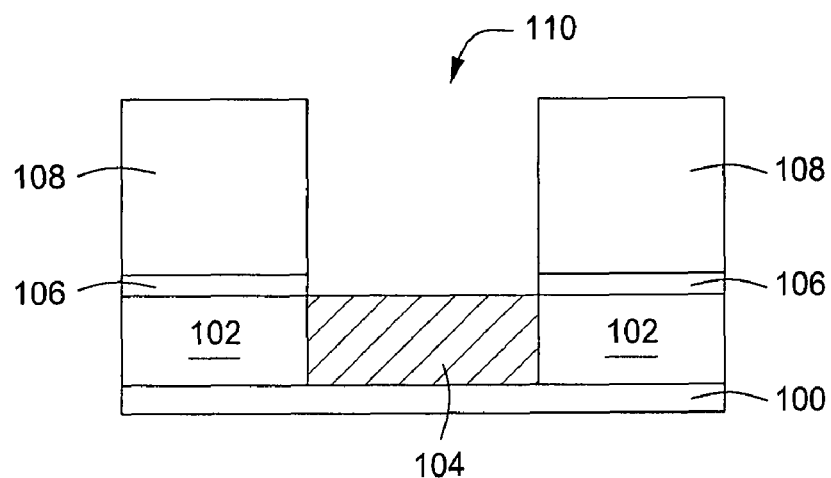
FIGS. 1A-C are sectional views of exemplary embodiment of forming interconnect structures in accordance with some embodiments of the present invention.

Titanium nitride films deposited in accordance with embodiments of the present invention may be utilized in a variety of applications. For example, FIGS. 1A-C respectively depict a non-limiting exemplary embodiment of stages of fabrication of a titanium nitride barrier layer on a substrate 100 suitable for use in fabricating an interconnect structure. As shown in FIG. 1A, a dielectric bulk insulating layer 108 and an underlying dielectric barrier layer 106 may be stacked on a previously formed interconnect having a first conductive layer 104 embedded in another dielectric bulk insulating layer 102.

The dielectric bulk insulating layers 108, 102 may comprise dielectric materials having a dielectric constant less than 4.0 (e.g., low-k materials). Non-limiting examples of suitable dielectric materials include carbon-containing silicon oxides (SiOC), such as BLACK DIAMOND® dielectric material available from Applied Materials, Inc., and other low-k polymers, such as polyamides. In some embodiments, the dielectric bulk insulating layers 108, 102 are carbon-containing silicon oxide (SiOC) layers.

In some embodiments, the dielectric barrier layer 106 may have a dielectric constant of about 5.5 or less. In some embodiments, the dielectric barrier layer 106 may comprise a carbon containing silicon layer (SiC), a nitrogen doped carbon containing silicon layer (SiCN), or the like. In some embodiments, the dielectric barrier layer 106 is a SiCN film. A non-limiting example of one suitable dielectric barrier layer material is BLOK® dielectric material, available from Applied Materials, Inc.

The first conductive layer 104 may be fabricated from a metal, such as copper, aluminum, tungsten, alloys thereof, or the like, or combinations thereof. A via/trench etching process may be performed to define a via/trench 110 in the dielectric bulk insulating layer 108 and the dielectric barrier layer 106, thereby exposing an upper surface of the first conductive layer 104.

Figure 1B:
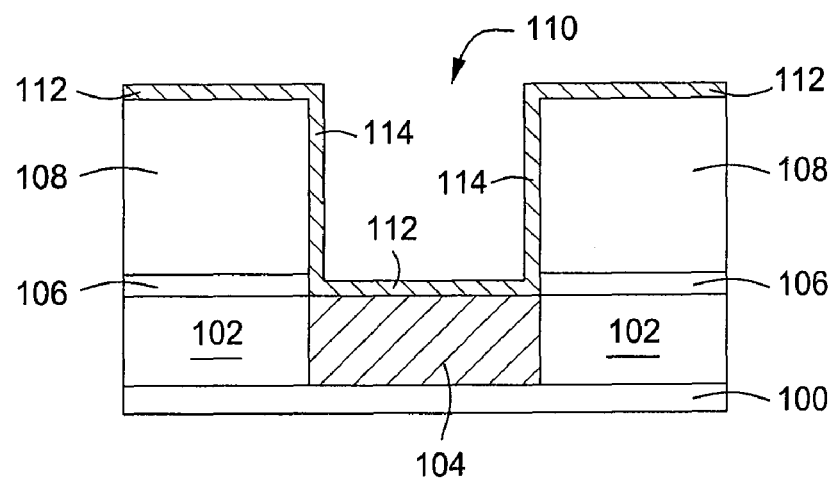

As shown in FIG. 1B, a titanium nitride barrier layer 112 may be deposited on the upper surface of the dielectric bulk insulating layer 108 and within the via/trench 110 (e.g., on sidewalls 114 of the via/trench 110 and on the upper surface of the first conductive layer 104). In some embodiments, the barrier layer 112 may be formed to a thickness of between about 190 to 210 Angstroms, although thinner and thicker layers may also be formed in accordance with the teachings provided herein. The barrier layer 112 may be formed from titanium nitride in accordance with the embodiments described herein, as described in greater detail below with respect to FIGS. 3-4.

Figure 1C:
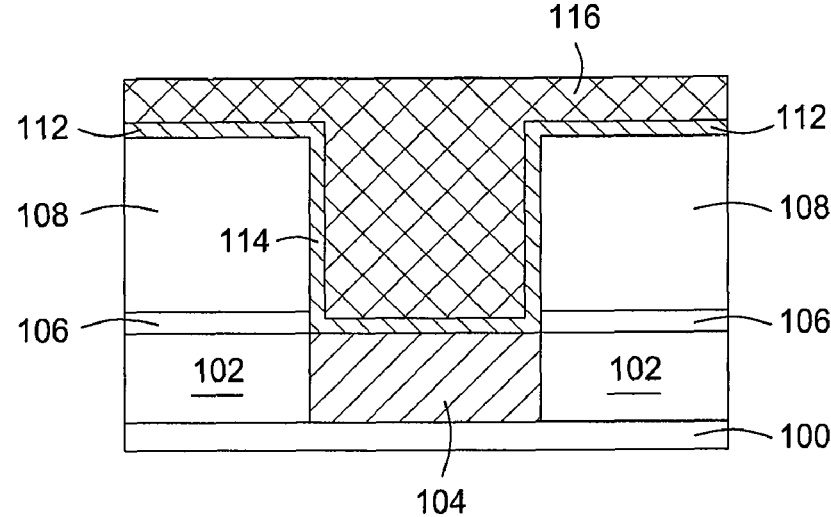

After the barrier layer 112 is deposited, a second conductive metal layer 116 may be used to fill the via/trench 110, thereby forming a metal interconnect structure on the substrate 100, as shown in FIG. 1C. The second conductive metal layer 116 may be fabricated from a metal, such as copper, aluminum, tungsten, alloys thereof, or the like, or combinations thereof.

The thicknesses of each of the various layers may be between about 10 Angstroms and 2,000 Angstroms, or in some embodiments, between about 50 Angstroms to about 500 Angstroms. However, thinner and thicker layers may also be formed in accordance with the teachings provided herein.

Figure 2:
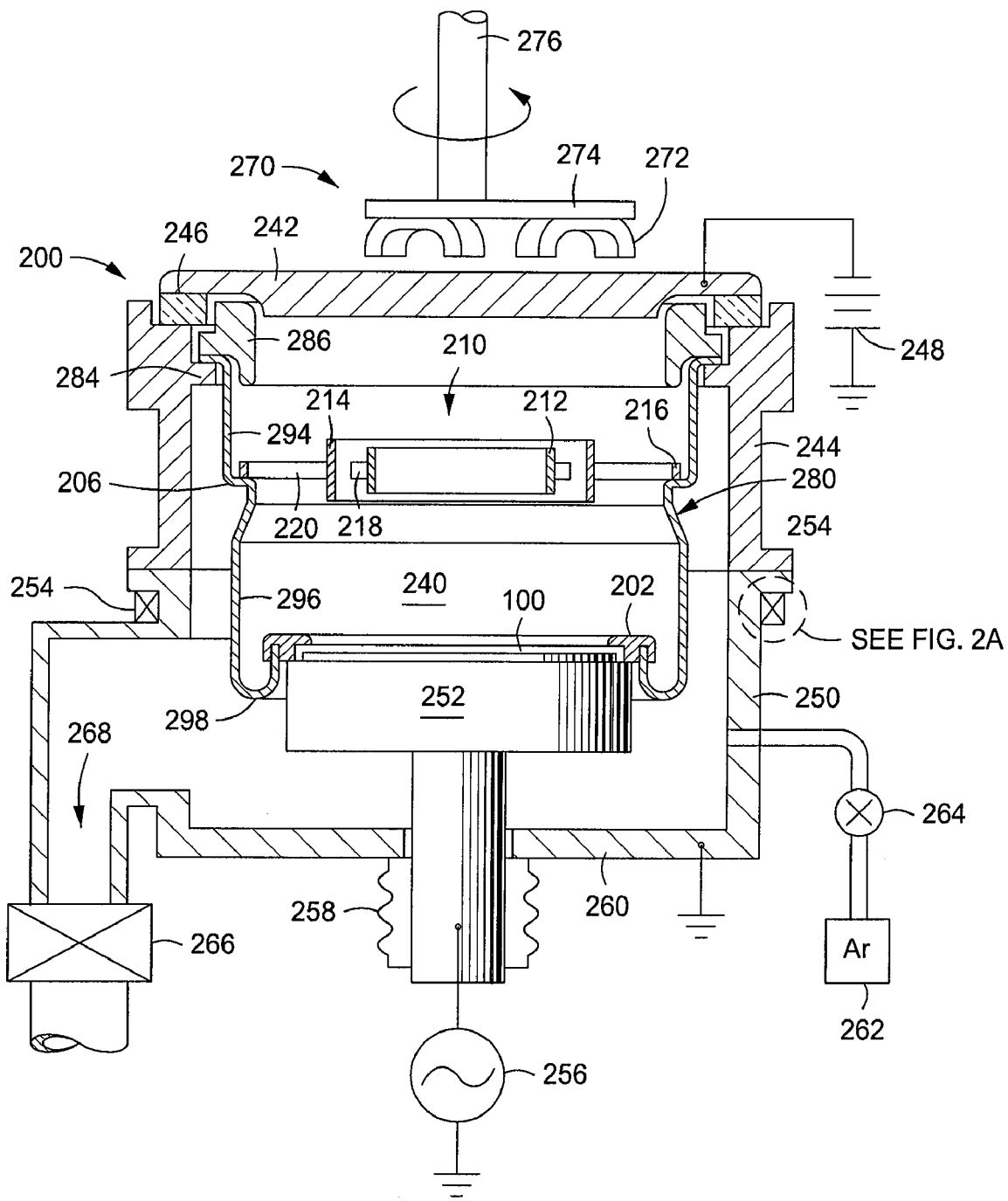
FIG. 2 depicts as schematic, cross-section view of an illustrative physical vapor deposition chamber that may be used to deposit a titanium nitride layer in accordance with some embodiments of the present invention.

The inventive methods described herein may be performed in a physical vapor deposition chamber as described below. FIG. 2 illustrates one embodiment of a physical vapor deposition chamber (processing chamber 200) in which the invention may be practiced. Examples of suitable PVD chambers include the ALPS® Plus and SIP ENCORE® PVD processing chambers, both commercially available from Applied Materials, Inc., of Santa Clara, Calif. It is contemplated that other processing chambers from other manufactures may also be utilized to perform the present invention.

In some embodiments, the processing chamber 200 contains a substrate support pedestal 252 for receiving the substrate 100 thereon, and a sputtering source, such as a target 242. The substrate support pedestal 252 may be located within a grounded enclosure wall 250, which may be a chamber wall (as shown) or a grounded shield (not shown).

The target 242 may be supported on a grounded conductive aluminum adapter 244 through a dielectric isolator 246. The target 242 comprises a material to be deposited on the substrate 100 during sputtering, such as titanium when depositing a titanium nitride film in accordance with embodiments of the present invention.

The substrate support pedestal 252 has a material-receiving surface facing the principal surface of the target 242 and supports the substrate 100 to be sputter coated in planar position opposite to the principal surface of the target 242. The substrate support pedestal 252 may support the substrate 100 in a central region 240 of the processing chamber 200. The central region 240 is defined as the region above the substrate support pedestal 252 during processing (for example, between the target 242 and the substrate support pedestal 252 when in a processing position).

The substrate support pedestal 252 is vertically movable through a bellows 258 connected to a bottom chamber wall 260 to allow the substrate 100 to be transferred onto the substrate support pedestal 252 through a load lock valve (not shown) in the lower portion of processing the chamber 200 and thereafter raised to a deposition, or processing position as depicted in FIG. 2. One or more processing gases may be supplied from a gas source 262 through a mass flow controller 264 into the lower part of the chamber 200. An exhaust port 268 may be provided and coupled to a pump (not shown) via a valve 266 for exhausting the interior of the processing chamber 200 and facilitating maintaining a desired pressure inside the processing chamber 200.

A controllable DC power source 248 may be coupled to the chamber 200 to apply a negative voltage, or bias, to the target 242. An RF power supply 256 may be coupled to the substrate support pedestal 252 in order to induce a negative DC bias on the substrate 100. In addition, in some embodiments, a negative DC self-bias may form on the substrate 100 during processing. In other applications, the substrate support pedestal 252 may be grounded or left electrically floating.

A rotatable magnetron 270 may be positioned proximate a back surface of the target 242. The magnetron 270 includes a plurality of magnets 272 supported by a base plate 274. The base plate 274 connects to a rotation shaft 276 coincident with the central axis of the chamber 200 and the substrate 100. The magnets 272 produce a magnetic field within the chamber 200, generally parallel and close to the surface of the target 242 to trap electrons and increase the local plasma density, which in turn increases the sputtering rate. The magnets 272 produce an electromagnetic field around the top of the chamber 200, and magnets 272 are rotated to rotate the electromagnetic field which influences the plasma density of the process to more uniformly sputter the target 242.

The chamber 200 further includes a grounded bottom shield 280 connected to a ledge 284 of the adapter 244. A dark space shield 286 is supported on the bottom shield 280 and is fastened to the shield 280 by screws or other suitable manner. The metallic threaded connection between the bottom shield 280 and the dark space shield 286 allows the two shields 280, 286 to be grounded to the adapter 244. The adapter 244 in turn is sealed and grounded to the aluminum chamber sidewall 250. Both shields 280, 186 are typically formed from hard, non-magnetic stainless steel.

The bottom shield 280 extends downwardly in an upper tubular portion 294 of a first diameter and a lower tubular portion 296 of a second diameter. The bottom shield 280 extends along the walls of the adapter 244 and the chamber wall 250 downwardly to below a top surface of the substrate support pedestal 252 and returns upwardly until reaching a top surface of the substrate support pedestal 252 (e.g., forming a u-shaped portion 298 at the bottom). A cover ring 202 rests on the top of the upwardly extending inner portion 200 of the bottom shield 280 when the substrate support pedestal 252 is in its lower, loading position but rests on the outer periphery of the substrate support pedestal 252 when it is in its upper, deposition position to protect the substrate support pedestal 252 from sputter deposition. An additional deposition ring (not shown) may be used to shield the periphery of the substrate 100 from deposition.

The chamber 200 may also be adapted to provide a more directional sputtering of material onto a substrate. In one embodiment, directional sputtering may be achieved by positioning a collimator 210 between the target 242 and the substrate support pedestal 252 to provide a more uniform and symmetrical flux of deposition material to the substrate 100.

The collimator 210 may rest on the ledge portion of the bottom shield 280, thereby grounding the collimator 210. The collimator 210 may be a metal ring and may include an outer tubular section and at least one inner concentric tubular section, for example, three concentric tubular sections 212, 214, 216 linked by cross struts 220, 218. The outer tubular section 216 rests on the ledge portion 206 of the bottom shield 280. The use of the bottom shield 280 to support the collimator 210 simplifies the design and maintenance of the chamber 200. At least the two inner tubular sections 212, 214 are of sufficient height to define high aspect-ratio apertures that partially collimate the sputtered particles. Further, the upper surface of the collimator 210 acts as a ground plane in opposition to the biased target 242, which facilitates keeping plasma electrons away from the substrate 100.

Figure 2A:
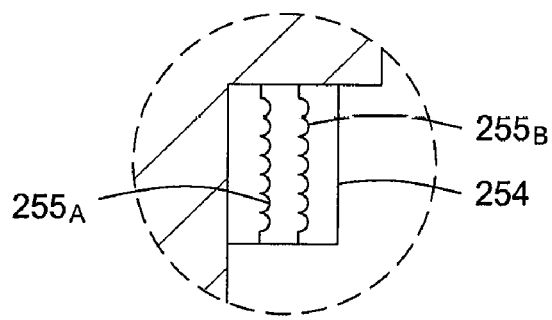
FIG. 2A depicts a detailed view of a portion of the physical deposition chamber of FIG. 2.

In some embodiments, a magnet 254 may be disposed about the chamber 200 for selectively providing a magnetic field between the substrate support pedestal 252 and the target 242. For example, as shown in FIG. 2, the magnet 254 may be disposed about the outside of the chamber wall 250 in a region just above the substrate support pedestal 252 when in processing position. The magnet 254 may be an electromagnet and may be coupled to a power source (not shown) for controlling the magnitude of the magnetic field generated by the electromagnet. In some embodiments, and as shown in the detail of FIG. 2A, the magnet 254 may include a plurality of inner magnetic coils 255A and a plurality of outer magnetic coils 255B arranged about the chamber 200. The number of individual coils in the plurality of inner magnetic coils 255A and the plurality of outer magnetic coils 255B may be selected as desired to provide a magnetic field having a desired strength.

The type and configuration of the magnet 254 or the plurality of inner magnetic coils 255A and the plurality of outer magnetic coils 255B may be varied in different processing chambers 200 or for different applications. The strength of the magnetic field formed by the magnet 254 or the plurality of inner magnetic coils 255A and the plurality of outer magnetic coils 255B may also be varied as desired for a particular application. For example, in some non-limiting embodiments, the plurality of inner magnetic coils 255A and the plurality of outer magnetic coils 255B may each receive a positive or negative current of between 0 to about 25 Amps to form the magnetic field. In some embodiments, the respective currents applied to the plurality of inner magnetic coils 255A and the plurality of outer magnetic coils 255B may have a difference between absolute values of magnitudes of less than or equal to about 3 Amps. It is contemplated that other values may be utilized as the hardware configuration permits.

The voltage and/or the current applied to the plurality of inner magnetic coils 255A may be controlled independently of the plurality of outer magnetic coils 255B. The configuration of the magnet 254 (and inner and outer magnetic coils 255A, 255B) shown in FIG. 2 is illustrative only and it is contemplated that other configurations of magnets may be utilized to provide the magnetic fields during processing as described in more detail below with respect to FIGS. 3-4.

Figure 5:
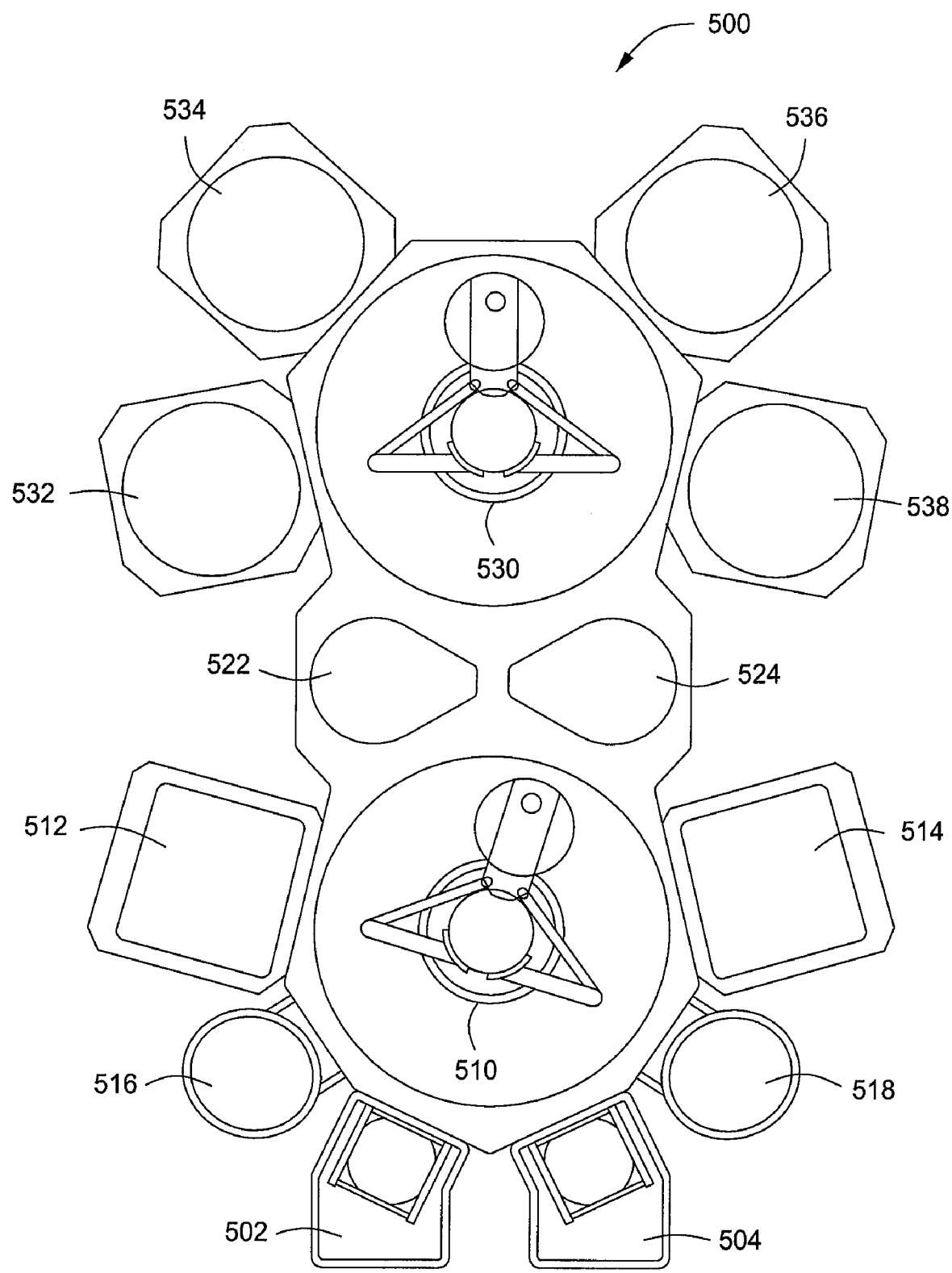
FIG. 5 is a schematic top view diagram of one example of a multi-chamber processing system which may be adapted to perform the processes disclosed herein.

FIG. 5 is a schematic top-view diagram of an exemplary multi-chamber processing system 500 that includes at least one chamber similar to the chamber 200 described above and that may be adapted to perform the processes disclosed herein. Examples of suitable multi-chamber processing systems include the ENDURA®, CENTURA®, and PRODUCER® processing systems, commercially available from Applied Materials, Inc. Another similar multi-chamber processing system that may be adapted to benefit from the invention is disclosed in U.S. Pat. No. 5,186,718, entitled "Stage Vacuum Wafer Processing System and Method," issued on Feb. 16, 1993, which is incorporated by reference herein.

The system 500 generally includes load lock chambers 502, 504 for the transfer of substrates 100 into and out from the system 500. Since the system 500 is operated under vacuum, the load lock chambers 502, 504 may be "pumped down" to maintain to facilitate entry and egress of substrates to the system. A first robot 510 may transfer the substrate 100 between the load lock chambers 502, 504, processing chambers 512, 514, transfer chambers 522, 524, and other chambers 516, 518. A second robot 530 may transfer the substrate 100 between processing chambers 532, 534, 536, 538 and the transfer chambers 522, 524. Furthermore, each processing chamber 512, 514, 516, and 518 may be outfitted to perform a number of substrate processing operations such as cyclical layer deposition including atomic layer deposition (ALD), chemical vapor deposition (CVD), physical vapor deposition (PVD), etch, pre-clean, de-gas, orientation and other substrate processes. At least one of the chambers 512, 514, 516, 518, 532, 534, 536, 538 is configured as the processing chamber 200 described above in FIG. 2.

The first robot 510 may also transfer substrates to or from one or more transfer chambers 522 and 524. The transfer chambers 522 and 524 are used to maintain ultrahigh vacuum conditions while allowing substrates to be transferred within the system 500. A second robot 530 may transfer substrates between the transfer chambers 522 and 524 and a second set of one or more processing chambers 532, 534, 536 and 538. Similar to processing chambers 512, 514, 516, and 518, the processing chambers 532, 534, 536, and 538 can be outfitted to perform a variety of substrate processing operations, such as cyclical layer deposition including atomic layer deposition (ALD), chemical vapor deposition (CVD), physical vapor deposition (PVD), etch, pre-clean, de-gas, and orientation. Any of the substrate processing chambers 512, 514, 516, 518, 532, 534, 536, and 538 may be removed from the system 500 if not necessary for a particular process to be performed by the system 500.

The processing system 500 may include one or more pre-clean chambers to preclean the substrate transferring into the chambers, one or more PVD chambers configured to deposit barrier layers, seed layers, or conductive metal layers. To enhance efficiency and throughput of the system, one configuration of the processing system includes two precleaning chambers, such as precleaning chambers 512, 514 configured to pre-clean the substrate surface, four ALD or PVD chambers, such as processing chambers 534, 536, 532, 538, configured to deposit barrier layers or to deposit seed layers disposed in connection to the back-end central transfer chamber. In some embodiments, the chambers 512, 514 are configured as precleaning chambers while the processing chambers 532, 534, 538, 538 are configured to deposit at least TiN by a PVD process.

In an exemplary embodiment, the substrate 100 may be transferred into the precleaning chambers 512, 514 to pre-clean the surface of the substrate 100. Following the precleaning step, the substrate 100 may be transferred into at least one of processing chambers 534, 536 to deposit the TiN barrier layer 112 on the substrate 100. The substrate 100 may then be transferred to at least one of processing chambers 532, 538 to fill the via/trench 110 on the substrate 100 with Al, Cu, W, or other conductive material.

In yet another exemplary embodiment, the substrate 100 may be transferred into one of the precleaning chambers 512, 514 to preclean the surface of the substrate 100. Following the precleaning step, the substrate 100 may then be transferred into at least one of the processing chambers 534, 536 to deposit the TiN barrier layer 112 on the substrate 100. After the barrier layer 112 is deposited, the substrate 100 may be transferred back to the precleaning chambers 512, 514, to perform an optional post treatment process. Alternatively, the post treatment process may be performed in any other treatment/annealing processing incorporated in the system 500 or any other suitable systems and chambers capable of performing the treatment process. Subsequently, the substrate 100 may be further transferred to another processing chamber 532, 538 to further fill the via/trench 110 on the substrate 100 with Al, Cu, W, or other conductive material. Alternatively, the via/trench 110 may be filled by another chambers, such as an electroplating (ECP) process, disposed in systems other than the system 500.

Figure 3:
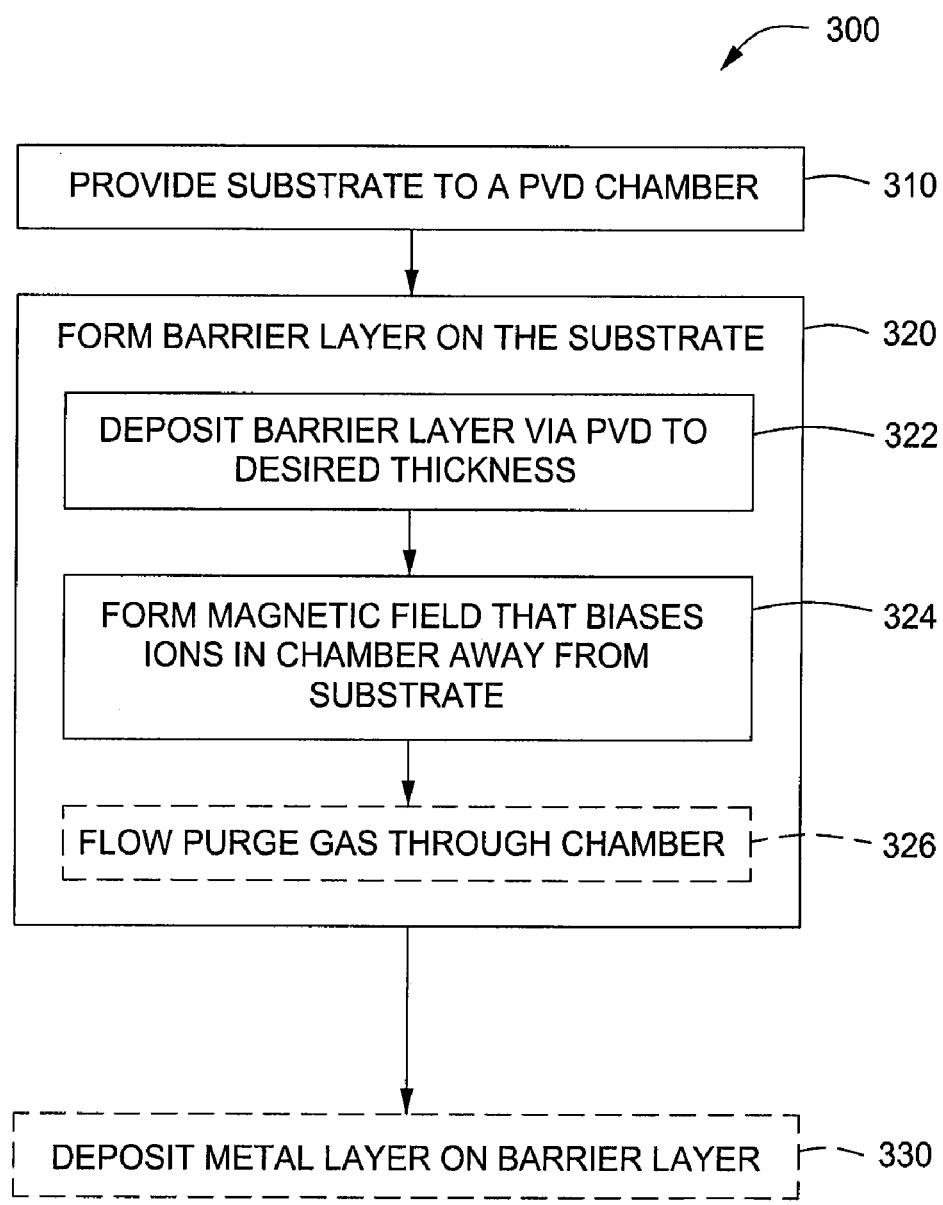
FIG. 3 is a flow diagram of one embodiment of a barrier layer formation process in metallization process in accordance with some embodiments of the present invention.
Figure 4A:
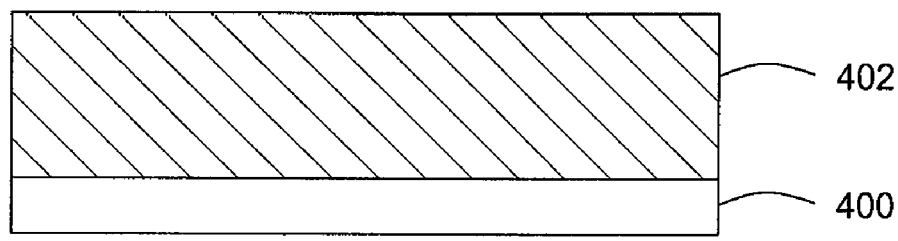
FIGS. 4A-4C respectively depict schematic cross-sectional views of stages of fabrication of an interconnect structure in accordance with some embodiments of the present invention.
Figure 4B:
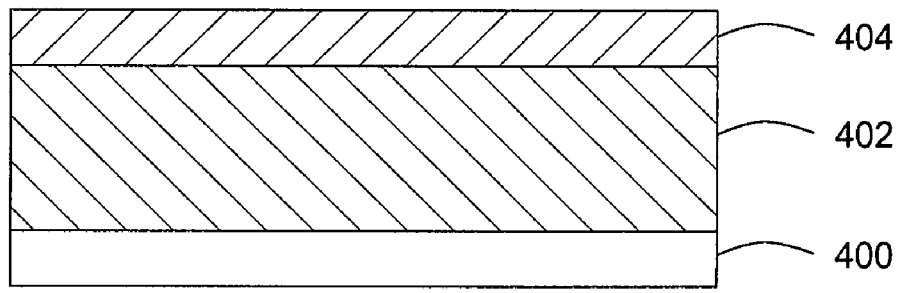
Figure 4C:
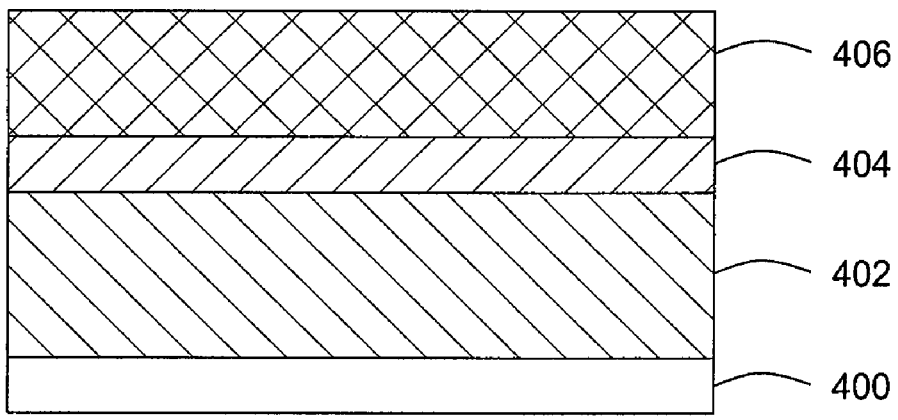

FIG. 3 illustrates a flow diagram of one embodiment of a TiN barrier layer formation process 300 according to some embodiments of the invention. FIGS. 4A-4C respectively depict schematic cross-sectional views illustrating the sequence of the barrier layer formation process 300. The process 300 may be performed in a plasma processing chamber, such as the processing chamber 200 depicted in FIG. 2, or other suitable deposition reactor.

The process 300 begins at 310 by providing a substrate upon which the TiN barrier layer is to be formed to a PVD chamber. The PVD chamber may be any suitable PVD chamber having a titanium target (such as the chamber 200 described above with respect to FIG. 2). In some embodiments, and as shown in FIG. 4A, a substrate 400 may be provided. The substrate 400 may be similar to the substrate 100 discussed above with respect to FIGS. 1A-C, and may have a structure formed thereon. For example, in some embodiments, and as shown in FIG. 4A, the substrate 400 may have a structure formed thereon including a first conductive layer 402. In some embodiments, the first conductive layer 402 may be formed by a metal material, such as copper, aluminum, tungsten, alloys thereof, or the like, or combinations thereof. In some embodiments, the first conductive layer 402 may be fabricated from copper or a copper alloy. In some embodiments, the first conductive layer 402, may be laterally bounded by a dielectric layer (not shown). For example, in some embodiments, such as in metal interconnect applications, the first conductive layer 402 may be similar to the first conductive layer 104 having the dielectric bulk insulating layer 102 laterally bounding the first conductive layer 104 (as described above with respect to FIGS. 1A-C).

Next, at 320, a barrier layer 404 may be deposited on the substrate 400, and/or upon any layers or structures disposed thereon (such as the first conductive layer 402). For example, at 322, the TiN barrier layer may be deposited by a PVD process to a desired thickness. In some embodiments, the PVD process may includes providing a deposition gas mixture into the process chamber 200 to react with source material sputtered from the target 242. A high voltage power may be supplied to the target 242 and the substrate support pedestal 252 during sputtering, thereby causing the source material to be sputtered from the target 242 and deposited on the substrate 400. In some embodiments, the bias power applied to the target 242 and the substrate support pedestal 252 may maintain a plasma formed from the deposition gas mixture in the process chamber 200. Ions from the plasma of the deposition gas mixture may bombard and sputter off material from the target 242, forming the TiN barrier layer 404 on the substrate 400.

The deposition gas mixture may include one or more reactive gases and, optionally, one or more non-reactive gases. In embodiments where a metal nitride is being formed (such as when the barrier layer 404 comprises TiN), the reactive gases may include a nitrogen-containing gas. Suitable examples of nitrogen-containing gases include nitrogen ($N_2$), nitrous oxide ($N_2O$), nitrogen dioxide ($NO_2$), ammonia ($NH_3$), or the like. The nitrogen-containing reactive gases may be either ionized in-situ by a plasma generated within the processing chamber 200, or ionized ex-situ by a remote plasma source disposed outside the processing chamber 200 and delivered into the processing chamber 200. The nitrogen-containing gas reacts with sputtered material from the target 242, thereby forming the barrier layer 404 on the substrate. In some embodiments, the nitrogen-containing gas may react with the titanium on the target 242, thereby forming a TiN layer on the target which may then be sputtered off, at least partially dissociated and ionized within the chamber, and ultimately deposited on the substrate 400.

In some embodiments, a non-reactive gas may be supplied in the deposition gas mixture to facilitate maintaining the plasma and/or providing additional ions to the plasma that may be accelerated towards the target 242 to assist sputtering the source material from the target 242. Examples of non-reactive gases include, but are not limited to, argon (Ar), helium (He), xenon (Xe), krypton (Kr), and the like.

In some embodiments, the material of the target is Ti, and the deposition gas mixture supplied into the chamber may include a reactive gas, such as $N_2$, and, optionally, an inert gas, such as Ar. The material of the target 242 and the gas mixture supplied during the PVD process may be varied in accordance with different process requirements.

In some embodiments, the deposition gas mixture supplied into the processing chamber 200 may include nitrogen ($N_2$) at a flow rate of between about 20 sccm and about 1000 sccm, such as, between about 90 sccm and about 200 sccm, or, for example, between about 100 sccm and about 120 sccm. In some embodiments, together with the nitrogen ($N_2$) discussed above, argon (Ar) may be provided into the processing chamber 200 at a flow rate of between about 0 sccm and about 1000 sccm, such as, between about 2 sccm and about 50 sccm, or, for example, between about 4 sccm and about 10 sccm.

In some embodiments, a lower flow of the nitrogen-containing gas may be provided to perform a metallic PVD process (so-called because the target substantially resists reacting with the reactive gas to form compounds on the surface of the target). In some embodiments, a metallic PVD process may be performed by providing nitrogen ($N_2$) at a flow rate of between about 1 sccm and about 70 sccm, such as, between about 20 sccm and about 70 sccm, or, for example, between about 60 sccm and about 70 sccm. In some embodiments, together with the nitrogen (N₂) discussed above, argon (Ar) may be provided into the processing chamber 200 at a flow rate of between about 0 sccm and about 1000 sccm, such as, between about 2 sccm and about 10 sccm, or, for example, between about 4 sccm and about 8 sccm.

In some embodiments, a higher flow rate of the nitrogen-containing gas may be provided to perform a poison PVD process (so-called because the target reacts with the reactive gas to form compounds on the surface of the target). In some embodiments, a poison PVD process may be performed by providing nitrogen (N₂) at a flow rate of between about 90 sccm and about 150 sccm, such as, between about 90 sccm and about 100 sccm, or, for example, between about 100 sccm and about 110 sccm. In some embodiments, together with the nitrogen (N₂) discussed above, argon (Ar) may be provided into the processing chamber 200 at a flow rate of between about 0 sccm and about 1000 sccm, such as, between about 6 sccm and about 10 sccm, or, for example, between about 8 sccm and about 10 sccm.

In each of the above embodiments, RF power may applied to the target 242 during processing. In some embodiments, an RF signal may be supplied at a power of between about 0 Watts and about 1,500 Watts, such as between about 100 Watts and about 1,000 Watts, for example, about 200 Watts and about 600 Watts. Alternatively, a DC signal may be supplied having a power of between about 1,000 Watts and about 40,000 Watts, such as between about 20,000 Watts and about 40,000 Watts, for example, about 35,000 Watts and about 38,000 Watts.

In some embodiments, a magnetic field may be provided that biases the ions in the chamber 200 toward the central region 240 of the processing chamber 200 (e.g., radially inward, or toward the substrate). For example, in some embodiments, the magnet 254 may be utilized to form a magnetic field that biases the ions in the chamber 200 toward the central region 240. By biasing the ions radially inward, toward the central region 240 of the processing chamber 200, the deposition rate may be enhanced.

In some embodiments, the magnetic field may be formed by applying a current to the magnet 254, or to at least one of the plurality of inner magnetic coils 255A and the plurality of outer magnetic coils 255B. In some embodiments, the magnetic field may be formed by applying a current to both of the plurality of inner magnetic coils 255A and the plurality of outer magnetic coils 255B. For example, in some embodiments, a current of between about 0 and 25 Amps may be provided to the plurality of outer magnetic coils 255B and a current of between about 0 and 25 Amps may be provided to the plurality of inner magnetic coils 255A. In some embodiments, a current of about 9 Amps may be provided to the plurality of outer magnetic coils 255B and a current of about −7.7 Amps may be provided to the plurality of inner magnetic coils 255A.

In some embodiments, a bias voltage may be applied to the substrate support pedestal 252 during processing. For example, in some embodiments, the RF power supply 256 (or other bias power source) may apply a signal to the substrate support pedestal 252 to induce, or increase, a bias voltage developed on the substrate 400. In some embodiments, the bias voltage on the substrate 400 may be between about 40 to 50 Volts. In some embodiments, the RF power supply 256 may supply a signal having a power of up to about 1000 Watts to the substrate support pedestal 252. In some embodiments, the RF power supply 256 may supply a signal having a power of about 300 Watts to the substrate support pedestal 252.

In addition to the foregoing, additional process parameters may be regulated while depositing the titanium nitride layer to the desired thickness. In some embodiments, a pressure of the deposition gas mixture in the process chamber 200 may be regulated between about 0 mTorr and about 100 mTorr, such as, between about 0.3 mTorr and about 5_mTorr. The substrate temperature may be maintained between about 18 degrees Celsius and about 500 degrees Celsius, such as, between about 20 degrees Celsius and about 300 degrees Celsius. The processing time may be set at a predetermined processing period or after a desired thickness of the barrier layer 404 is deposited on the substrate 400. In some embodiments, the processing time may be between about 1 to about 180 seconds, such as between about 5 to about 50 seconds.

Upon depositing the barrier layer 404 to a desired thickness, a magnetic field may be formed that biases the ions in the processing chamber away from the substrate 400, as shown at 324. The magnetic field may bias the ions in the chamber away from the substrate radially (e.g., away from the central region 240, and/or toward the grounded enclosure wall 250). The magnetic field may be formed utilizing, for example, the magnet 254 of the chamber 200 (described above with respect to FIG. 2). In some embodiments, the magnetic field may be formed utilizing the plurality of inner magnetic coils 255A and the plurality of outer magnetic coils 255B. The magnetic field may facilitate pulling charged particles floating in the plasma away from the substrate 400 to prevent their deposition thereon.

In some embodiments, the magnetic field may be formed by applying a current to the magnet 254, or to at least one of the plurality of inner magnetic coils 255A and the plurality of outer magnetic coils 255B. In some embodiments, the magnetic field may be formed by applying a current to both of the plurality of inner magnetic coils 255A and the plurality of outer magnetic coils 255B. For example, in some embodiments, a current of between about 0 and 25 Amps may be provided to the plurality of outer magnetic coils 255B and a current of between about 0 and 25 Amps may be provided to the plurality of inner magnetic coils 255A. In some embodiments, a current of about 9 Amps may be provided to the plurality of outer magnetic coils 255B and a current of about −9 Amps may be provided to the plurality of inner magnetic coils 255A.

In some embodiments, the magnetic field may be formed at about the same time the plasma in the chamber is extinguished. The plasma may alternatively be extinguished prior to or after forming the magnetic field. The magnetic field may be formed to any suitable strength that facilitates biasing the ions in the chamber away from the substrate. The magnetic field, in pulling the ions in the chamber away from the substrate, may facilitate reducing the number of particles that may undesirably deposit on the substrate. In some embodiments, the magnetic field has a magnitude sufficiently small to not adversely affect film properties of the barrier layer by causing ions to impact the barrier layer at a steep angle, by removing deposited material from the surface of the barrier layer, or the like.

The magnetic field may be maintained for any suitable period of time to facilitate removing any charged particles from the chamber, or at least from the region above the substrate (e.g., the central portion 240). In some embodiments, the magnetic field may be maintained for up to about 3 seconds. In some embodiments, the magnetic field may be maintained for about 1 second.

In some embodiments, while biasing ions away from the substrate, the bias voltage on the substrate 400 may be reduced and/or removed. For example, in some embodiments, the power of the signal applied by the RF power supply 256 (or other bias power source) to the substrate support pedestal 252 may be decreased or removed to reduce, or eliminate, any bias voltage developed on the substrate 400. In some embodiments were a self-induced bias exists on the substrate 400, removing the signal applied by the RF power supply 256 (or other bias power source) to the substrate support pedestal 252 may significantly reduce the bias voltage, although not completely eliminating the bias voltage. For example, in some embodiments, the signal provided by the RF power supply 256 at 322 during deposition of the barrier layer 404 to the desired thickness may be removed (e.g., the power may reduced to 0 Watts). Reducing and/or removing the substrate bias may facilitate reducing the probability that charged particles disposed in the chamber after the plasma is extinguished will not be attracted to the substrate 400.

In some embodiments, as indicated at 326 in phantom, a purge gas may be provided to the processing chamber 200 upon completion of depositing the barrier layer 404 to the desired thickness. The purge gas may be provided, at least in part, prior to, during, or after the formation of the magnetic field that biases ions away from the substrate 400. The purge gas may comprise a non-reactive gas. Examples of non-reactive gases include, but are not limited to, argon (Ar), helium (He), xenon (Xe), krypton (Kr), and the like. In some embodiments, the purge gas comprises argon (Ar).

In some embodiments, the purge gas may be supplied into the processing chamber 200 at a flow rate of between about 0 sccm and about 1,000 sccm, such as, between about 2 sccm and about 50 sccm, or, for example, between about 4 sccm and about 10 sccm. The purge gas may be flowed through the processing chamber 200 while maintaining a pressure in the process chamber 200 of between about 0 mTorr and about 100 mTorr, such as, between about 0.3 mTorr and about 5 mTorr. The purge gas may be flowed through the processing chamber 200 for a desired period of time to facilitate removing charged and uncharged particles from the processing chamber 200 and preventing deposition of these particles on the substrate 400. In some embodiments, the purge gas may be flowed for at least 3 seconds. In some embodiments, the purge gas may be flowed for at least 5 seconds.

Upon completion of the deposition of the barrier layer 404 at 320, the process ends and the substrate 400 may be further processed as required for a particular application. For example, as shown in phantom at 330, a metal layer 406 may be deposited on the barrier layer 404. In some embodiments, for example, the metal layer 402, barrier layer 404, and metal layer 406 may form at least part of a metal interconnection structure on the substrate 400 (such as described above with respect to FIGS. 1A-C). The metal layer 406 may comprise copper (Cu), aluminum (Al), tungsten (W), alloys thereof, or the like, or combinations thereof. The metal layer 406 may be deposited by any suitable manner, such as by electroplating, CVD, PVD, ALD, or the like.

In some exemplary embodiments, the first conductive layer 402 may be a copper layer (Cu), the barrier layer 404 may a titanium nitride (TiN) barrier layer, and the metal layer 406 may be an aluminum layer (Al) and may form an interconnection structure on the substrate 400. In such embodiments, a copper (Cu) and aluminum (Al) hybrid interconnect structure with an improved and robust barrier layer is accordingly formed on the substrate. The improved barrier layer provides a stable, dense layer having good barrier properties that facilitate preventing the underlying first conductive layer (e.g., 104) from diffusing into the second conductive layer (e.g., 116) or adjacent dielectric layer (e.g., 108) while maintaining the via and/trench resistivity at a desired range. The copper (Cu) and aluminum (Al) hybrid interconnection structure may be used, for example, in flash memory backend interconnection (BEOL) processes.

Thus, methods of forming titanium nitride layers having reduced particle defects are provided herein. Such titanium nitride layers may be advantageously used in many applications, for example, as a barrier layer for an interconnection structure.

While the foregoing is directed to embodiments of the present invention, other and further embodiments of the invention may be devised without departing from the basic scope thereof, and the scope thereof is determined by the claims that follow.

What is claimed is:

1. A method of forming a titanium nitride layer on a substrate, comprising:
   providing a substrate into a processing chamber having a target comprising titanium disposed therein;
   supplying a nitrogen-containing gas into the processing chamber;
   sputtering a titanium source material from the target in the presence of a plasma formed from the nitrogen-containing gas to deposit a titanium nitride layer on the substrate; and
   upon depositing the titanium nitride layer to a desired thickness, forming a magnetic field that biases ions in the processing chamber away from the substrate.

2. The method of claim 1, further comprising:
   forming a magnetic field that biases ions in the processing chamber toward a central region of the processing chamber while depositing the titanium nitride layer to the desired thickness.

3. The method of claim 1, further comprising:
   applying a substrate bias while depositing the titanium nitride layer; and
   reducing the substrate bias upon depositing the titanium nitride layer to the desired thickness.

4. The method of claim 1, further comprising:
   purging the processing chamber with a non-reactive gas upon forming the titanium nitride layer to the desired thickness.

5. The method of claim 1, wherein the magnetic field is formed by one or more magnets disposed about an outer perimeter of the processing chamber.

6. The method of claim 5, wherein the one or more magnets are a plurality of electromagnets arranged in an inner magnet ring and an outer magnet ring disposed radially outward of the inner magnet ring.

7. A method of forming an interconnection structure on a substrate, comprising:
   providing a substrate having a first conductive layer disposed thereon;
   forming a titanium nitride barrier layer on the first conductive layer;
   upon depositing the titanium nitride barrier layer to a desired thickness, forming a magnetic field that biases ions in the processing chamber away from the substrate; and
   forming a second conductive layer on the titanium nitride barrier layer.

8. The method of claim 7, further comprising:
   forming a magnetic field that biases ions in the processing chamber toward a central region of the processing chamber while depositing the titanium nitride barrier layer to the desired thickness.

9. The method of claim 8, further comprising:

applying a substrate bias while depositing the titanium nitride barrier layer; and reducing the substrate bias upon depositing the titanium nitride barrier layer to the desired thickness.

10. The method of claim 7, further comprising:

purging the processing chamber with a non-reactive gas upon forming the titanium nitride barrier layer to the desired thickness.

11. The method of claim 7, wherein the magnetic field is formed by one or more magnets disposed about an outer perimeter of the processing chamber.

12. The method of claim 11, wherein the one or more magnets are a plurality of electromagnets arranged in an inner magnet ring and an outer magnet ring disposed radially outward of the inner magnet ring.

13. The method of claim 7, wherein the first and the second conductive layers each comprise at least one of copper, aluminum, or tungsten.

14. A method of forming an interconnection structure on a substrate, comprising:

providing a substrate having a dielectric layer disposed on a first conductive layer comprising copper, the dielectric layer having a via formed therein to expose a portion of an upper surface of the first conductive layer;

depositing a titanium nitride barrier layer by a PVD process within the via, the upper surface of the dielectric layer and the exposed surface of the first conductive layer;

upon forming the titanium nitride barrier layer to a desired thickness, forming a magnetic field that biases ions formed during the PVD process away from the substrate; and depositing a second conductive layer atop the titanium nitride barrier layer to fill the via formed within the dielectric layer.

15. The method of claim 14, further comprising:

forming a magnetic field that biases ions in the processing chamber toward a central region of the processing chamber while depositing the titanium nitride barrier layer to the desired thickness.

16. The method of claim 14, further comprising:

applying a substrate bias while depositing the titanium nitride barrier layer; and reducing the substrate bias upon depositing the titanium nitride barrier layer to the desired thickness.

17. The method of claim 14, further comprising:

purging the processing chamber with a non-reactive gas upon forming the titanium nitride barrier layer to the desired thickness.

18. The method of claim 14, wherein the magnetic field is formed by one or more magnets disposed about an outer perimeter of the processing chamber.

19. The method of claim 18, wherein the one or more magnets are a plurality of electromagnets arranged in an inner magnet ring and an outer magnet ring disposed radially outward of the inner magnet ring.

20. The method of claim 14, wherein the second conductive layer comprises at least one of copper, aluminum, or tungsten.

* * * * *